United States Patent
Kim et al.

(10) Patent No.: US 10,622,318 B2
(45) Date of Patent: Apr. 14, 2020

(54) SEMICONDUCTOR PACKAGE DEVICE AND METHOD OF MANUFACTURING THE SAME

(71) Applicant: Advanced Semiconductor Engineering Korea, Inc., Gyeonggi-Do (KR)

(72) Inventors: Seokbong Kim, Gyeonggi-Do (KR); Sunju Park, Gyeonggi-Do (KR)

(73) Assignee: ADVANCED SEMICONDUCTOR ENGINEERING KOREA, INC., Paju-si, Gyeonggi-Do (KR)

( * ) Notice: Subject to any disclaimer, the term of this patent is extended or adjusted under 35 U.S.C. 154(b) by 0 days.

(21) Appl. No.: 15/497,655

(22) Filed: Apr. 26, 2017

(65) Prior Publication Data

US 2018/0315719 A1    Nov. 1, 2018

(51) Int. Cl.
| | |
|---|---|
| H01L 23/66 | (2006.01) |
| H01L 23/552 | (2006.01) |
| H01L 23/498 | (2006.01) |
| H01L 23/64 | (2006.01) |
| H01L 21/56 | (2006.01) |
| H01Q 1/22 | (2006.01) |
| H01L 23/31 | (2006.01) |

(52) U.S. Cl.
CPC .......... *H01L 23/66* (2013.01); *H01L 21/561* (2013.01); *H01L 23/49811* (2013.01); *H01L 23/49827* (2013.01); *H01L 23/552* (2013.01); *H01L 23/642* (2013.01); *H01Q 1/2283* (2013.01); *H01L 23/3121* (2013.01); *H01L 2223/6677* (2013.01); *H01L 2224/48091* (2013.01)

(58) Field of Classification Search
CPC .......... H01L 23/66; H01Q 1/526; H01Q 1/52; H01Q 1/22; H01Q 1/2283
See application file for complete search history.

(56) References Cited

U.S. PATENT DOCUMENTS

| | | | |
|---|---|---|---|
| 5,787,548 A * | 8/1998 | Tzen ................. | A01G 17/10 16/82 |
| 6,781,219 B2 | 8/2004 | Bissey | |
| 7,166,905 B1 | 1/2007 | Shah | |
| 7,989,270 B2 * | 8/2011 | Huang ................. | H01L 23/50 438/127 |
| 9,419,071 B2 | 8/2016 | Pagani et al. | |
| 2007/0063903 A1 * | 3/2007 | Mun ................. | H01Q 1/243 343/702 |
| 2011/0062549 A1 * | 3/2011 | Lin ................. | H01L 23/3128 257/531 |
| 2014/0035097 A1 * | 2/2014 | Lin ................. | H01L 23/552 257/531 |
| 2015/0070228 A1 * | 3/2015 | Gu ................. | H01Q 1/2283 343/727 |

(Continued)

*Primary Examiner* — Wael M Fahmy
*Assistant Examiner* — Sarah K Salerno
(74) *Attorney, Agent, or Firm* — Foley & Lardner LLP

(57) ABSTRACT

A semiconductor package device includes a carrier, an electronic component, a package body and an antenna. The carrier has a first surface, a second surface opposite to the first surface and a lateral surface extending between the first surface and the second surface. The electronic component is disposed on the first surface of the carrier. The package body is disposed on the first surface of the carrier and encapsulates the electronic component. The antenna is disposed on at least a portion of the lateral surface of the carrier.

20 Claims, 14 Drawing Sheets

(56) References Cited

U.S. PATENT DOCUMENTS

| | | | |
|---|---|---|---|
| 2015/0084046 A1* | 3/2015 | Kato | H01L 27/1255 |
| | | | 257/43 |
| 2015/0145107 A1* | 5/2015 | Ng | H01L 23/552 |
| | | | 257/659 |
| 2015/0357479 A1 | 12/2015 | Yamazaki | |
| 2018/0026342 A1* | 1/2018 | Chen | H01Q 1/243 |
| | | | 343/702 |

* cited by examiner

SEMICONDUCTOR PACKAGE DEVICE AND METHOD OF MANUFACTURING THE SAME

BACKGROUND

1. Technical Field

The present disclosure relates to a semiconductor package device and a method of manufacturing the same, and more particularly, to a semiconductor package device with an antenna pattern and a method of manufacturing the same.

2. Description of the Related Art

Wireless communication devices, such as cell phones, can include antennas for transmitting and receiving radio frequency (RF) signals. Some wireless communication devices include an antenna and a communication module, each disposed on different parts of a circuit board. Under some approaches, the antenna and the communication module are separately manufactured and electrically connected together after being placed on the circuit board. Accordingly, separate manufacturing costs may be incurred for both components. Furthermore, it may be difficult to reduce a size of the wireless communication device to attain a suitably compact product design. In addition, an RF signal transmission path between the antenna and the communication module may be long, thereby reducing quality of a signal transmitted between the antenna and the communication module.

SUMMARY

In an aspect according to some embodiments, a semiconductor package device includes a carrier, an electronic component, a package body and an antenna. The carrier has a first surface, a second surface opposite to the first surface and a lateral surface extending between the first surface and the second surface. The electronic component is disposed on the first surface of the carrier. The package body is disposed on the first surface of the carrier and encapsulates the electronic component. The antenna is disposed on at least a portion of the lateral surface of the carrier.

In another aspect according to some embodiments, a method of manufacturing a semiconductor package device includes: providing a plurality of carrier units, each of the carrier units having a first surface and a second surface opposite to the first surface; disposing an antenna pattern between the first surface and the second surface and on a periphery of each of the carrier units; mounting an electronic component on the first surface of each of the carrier units; disposing a package body on the first surface of each of the carrier units to encapsulate the electronic component; and dividing the carrier units into a plurality of separated carrier units to expose the antenna pattern of each of the carrier units.

Figure 1A:
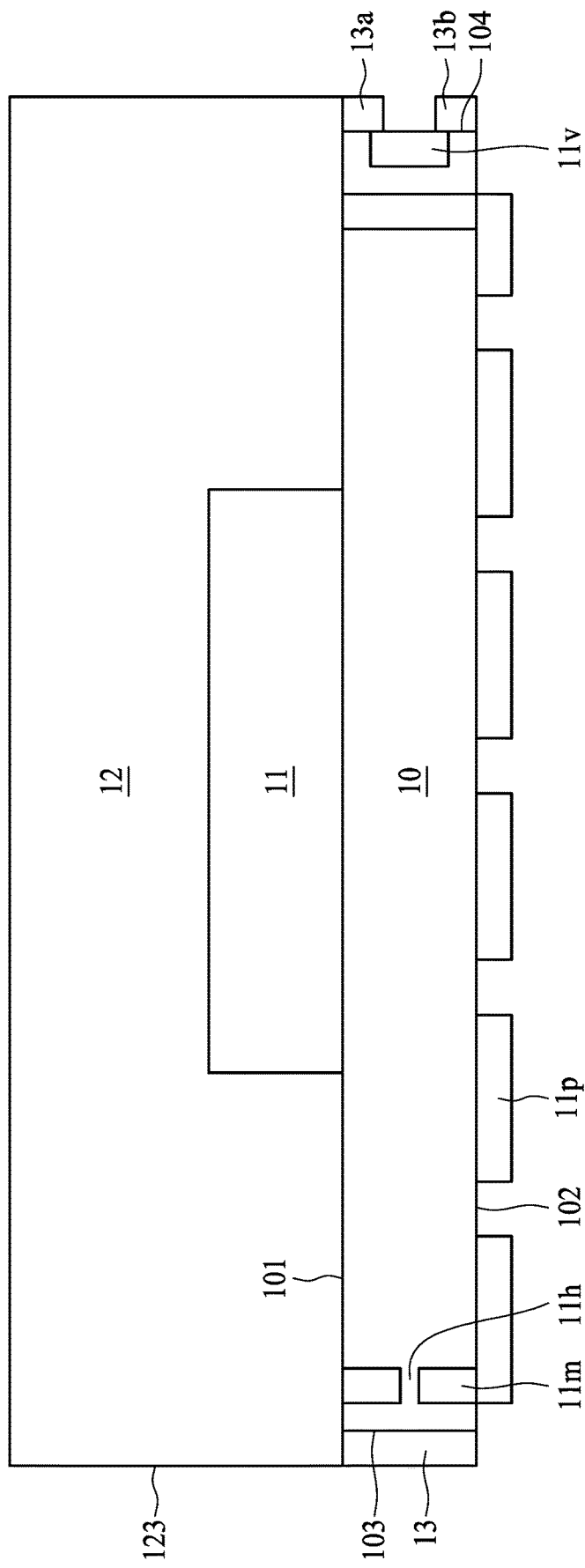
FIG. 1A illustrates a cross-sectional view of a semiconductor package device in accordance with some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

FIG. 1A illustrates a cross-sectional view of a semiconductor package device 1 in accordance with some embodiments of the present disclosure. The semiconductor package device 1 includes a substrate 10, an electronic component 11, a package body 12 and an antenna 13.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element. The substrate has a surface 101 and a surface 102 opposite to the surface 101. In some embodiments, the surface 101 of the substrate 10 is referred to as a top surface or a first surface and the surface 102 of the substrate 10 is referred to as a bottom surface or a second surface. The substrate 10 further has lateral surfaces 103 and 104. The lateral surface 103 extends between the first surface 101 and the second surface 102. The lateral surface 104 extends between the first surface 101 and the second surface 102 and is opposite to the lateral surface 103.

The substrate 10 includes a conductive element 11m therein. The conductive element 11m is disposed along and adjacent to the lateral surfaces 103 and 104 of the substrate 10. The conductive element 11m is connected to a grounding segment of the substrate 10 to provide an electromagnetic interference (EMI) shield. For example, the conductive element 11m can prevent the electronic component 11 from being interfered with by the radiation emitted by the antenna 13. The conductive element 11m may have or define at least one hole 11h, and thus the antenna 13 can be connected with the electronic component 11 by a conductive connection passing through the hole 11h. In some embodiments, the substrate 10 may include a plurality of conductive contacts 11p on its bottom surface 102 to provide electrical connections between the semiconductor package device 1 and other circuits. In some embodiments, the substrate 10 may be a multi-layer substrate and the feeding element of the antenna 13 can be disposed at any layer of the substrate 10 depending on design specifications.

The electronic component 11 is disposed on the top surface 101 of the substrate 10. The electronic component 11 may include a passive electronic component, such as a capacitor, a resistor or an inductor, or an active electronic component, such as an integrated circuit (IC) chip or a die. The electronic component 11 may be electrically connected to the substrate 10 (e.g., to the RDL), and electrical connection may be attained by way of flip-chip or wire-bond techniques.

The antenna 13 is disposed on the lateral surface 103 of the substrate 10. The antenna 13 is configured to radiate a directional radiation pattern. The pattern might be perpendicular to the lateral surface 103 of the substrate 10. In some embodiments, the antenna 13 includes end-fire antennas. In some embodiments, the antenna may include a first antenna pattern 13a and a second antenna pattern 13b. The first antenna pattern 13a and the second antenna pattern 13b are disposed on the lateral surface 104 of the substrate 10. The first antenna pattern 13a and the second antenna pattern 13b are physically separated from each other and are electrically connected through an electrical connection 11v (e.g., a via) within the substrate 10.

The package body 12 is disposed on the top surface 101 of the substrate 10 to cover or encapsulate the electronic component 11. In some embodiments, the package body 12 includes an epoxy resin including fillers, a molding compound (e.g., an epoxy molding compound or other molding compound), a polyimide, a phenolic compound or material, a material including a silicone dispersed therein, or a combination thereof. In some embodiments, a lateral surface 123 of the package body 12 and the lateral surface 103 of the substrate 10 are not coplanar. For example, the lateral surface 123 of the package body 12 protrudes from the lateral surface 103 of the substrate 10 in a direction parallel to the top surface 101 of the substrate 10 (e.g., the lateral surface 103 of the substrate 10 is recessed from the lateral surface 123 of the package body 12). The lateral surface 123 of the package body 12 is substantially coplanar with the antenna 13.

In some comparable wireless devices, an antenna array and other electronic components are integrated into a single package device to reduce the total size of the wireless devices. However, due to a limited space of a clean area on which the antenna array can be disposed, it can be difficult to improve a performance (such as gain or bandwidth) of the antenna array. In accordance with some embodiments of the present disclosure, by disposing the antenna 13 or the first and second antenna patterns 13a, 13b on the lateral surfaces 103, 104 of the substrate 10, the clean area can be increased without increasing the size of the package device. Therefore, for a given size, the semiconductor package device 1 can accommodate more antennas than some other wireless devices, which can in turn increase the performance of the antenna array.

Figure 1B:
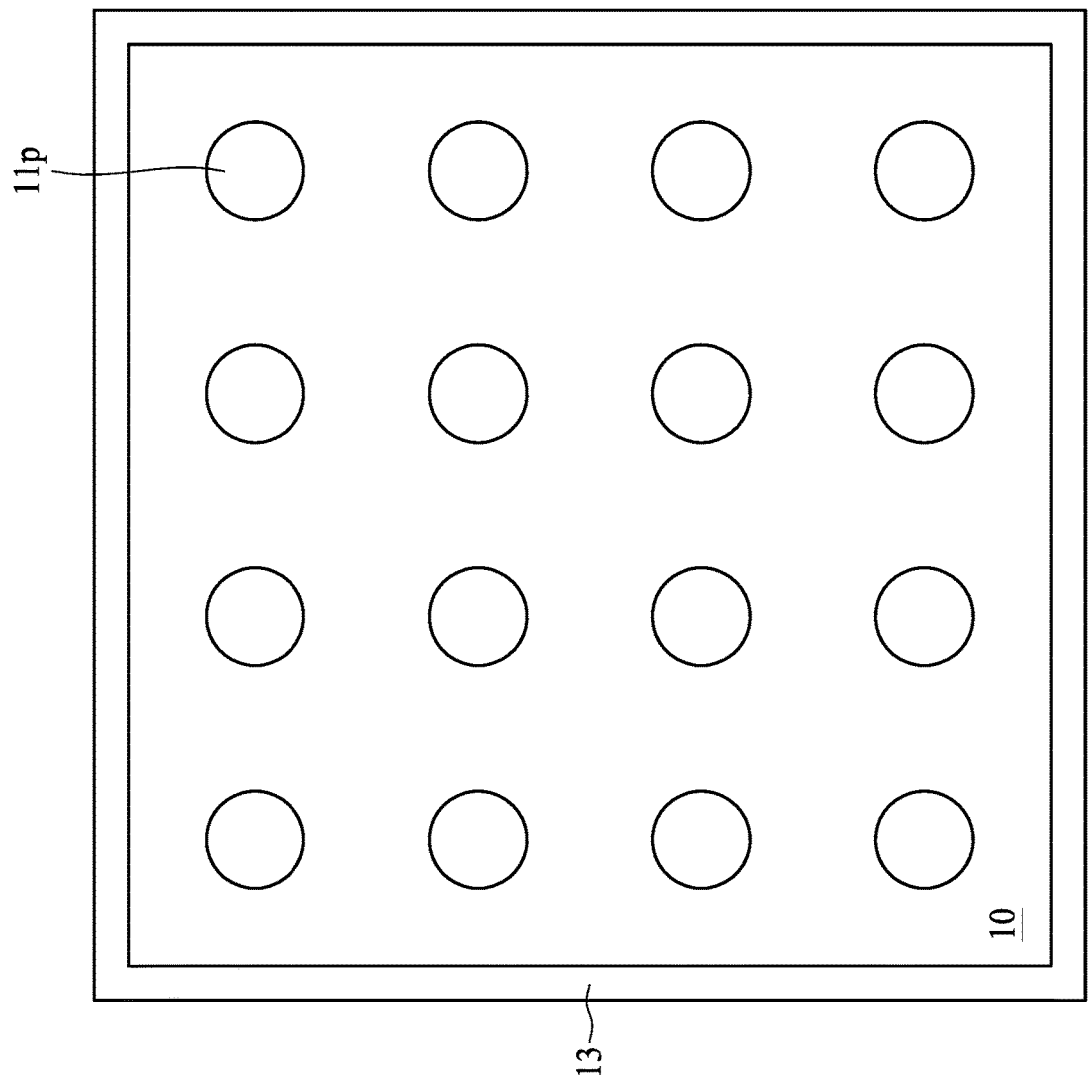
FIG. 1B illustrates a bottom view of a semiconductor package device in accordance with some embodiments of the present disclosure.

FIG. 1B is a bottom view of the semiconductor package device 1 shown in FIG. 1A. The antenna 13 is arranged along or near the lateral surfaces of the substrate 10 to surround the substrate 10. The substrate 10 may include a plurality of conductive contacts 11p (such as solder balls or conductive pads) on its bottom surface to provide electrical connections between the semiconductor package device 1 and other circuits.

Figure 2:
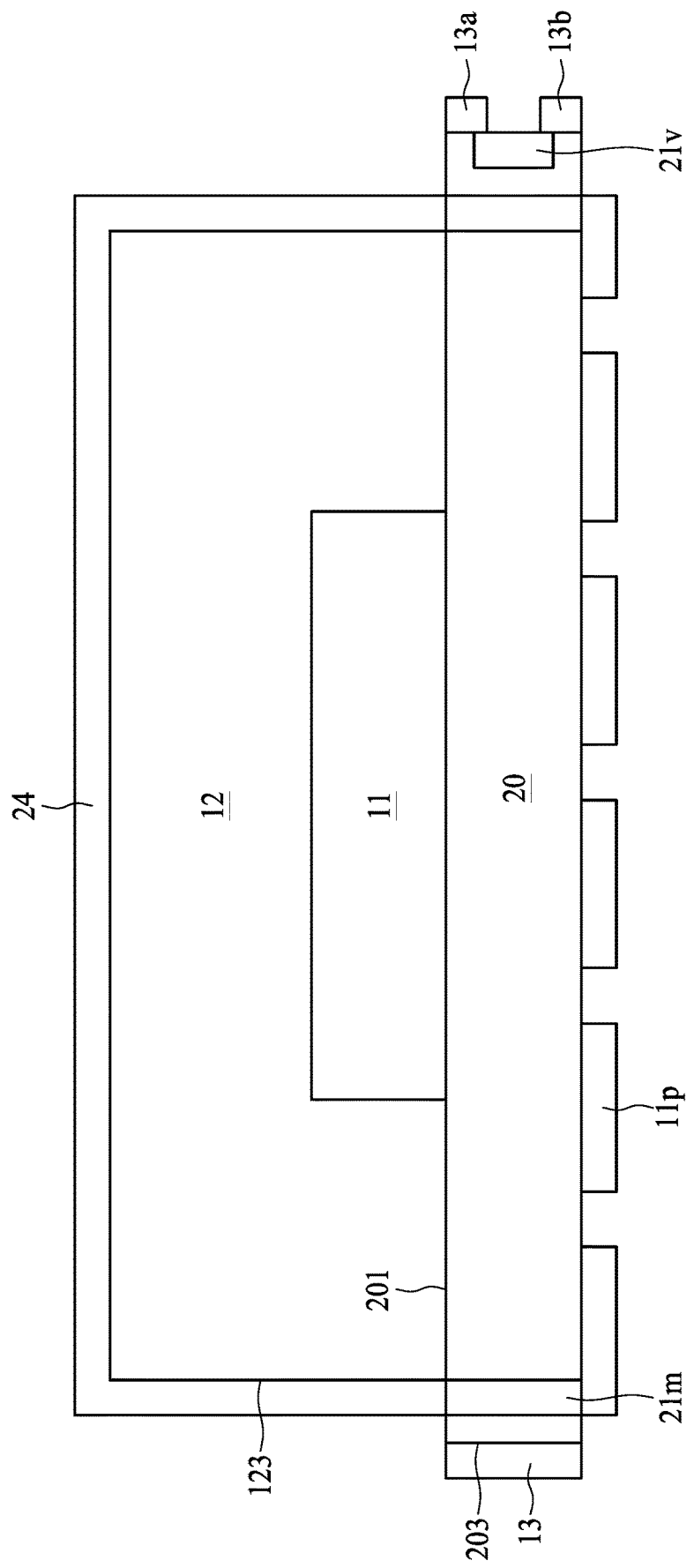
FIG. 2 illustrates a cross-sectional view of a semiconductor package device in accordance with some embodiments of the present disclosure.

FIG. 2 illustrates a cross-sectional view of a semiconductor package device 2 in accordance with some embodiments of the present disclosure. The semiconductor package device 2 is similar to the semiconductor package device 1 in FIG. 1A, and the differences therebetween are that the lateral surface 203 of the substrate 20 protrudes from the lateral surface 123 of the package body in a direction parallel to the top surface 201 of the substrate 20 and that the semiconductor package device 2 further includes a shielding layer 24.

The shielding layer 24 covers exterior surfaces of the package body 12. The shielding layer 24 is electrically connected to the conductive element 21m of the substrate 20. The shielding layer 24 is grounded through the conductive element 21m. The shielding layer 24 and the conductive element 21m together provide EMI shielding for the electronic component 11. In comparison with the conductive element 11m of the semiconductor package device 1 shown in FIG. 1, the shielding layer 24 and the conductive element 21m of the semiconductor package device 2 provide improved electromagnetic shielding capabilities for the electronic component 11.

In some embodiments, the shielding layer 24 is a conductive thin film, and may include, for example, aluminum (Al), copper (Cu), chromium (Cr), tin (Sn), gold (Au), silver (Ag), nickel (Ni) or stainless steel, or a mixture, an alloy, or other combination thereof. The shielding layer 24 may include a single conductive layer or multiple conductive layers. In some embodiments, the shielding layer 24 includes multiple conductive layers, and the multiple conductive layers may include a same material, some of the multiple conductive layers may include different materials from each other (e.g., while some of the multiple conductive layers include the same material), or each of the multiple conductive layers may include different materials from each other. In some embodiments, each conductive layer of the shielding layer 24 has a thickness of up to about 200 micrometers (μm), such as up to about 150 μm, up to about 100 μm, up to about 50 μm, up to about 10 μm, up to about 5 μm, up to about 1 μm, or up to about 500 nanometers (nm), and down to about 100 nm or less, down to about 50 nm or less, or down to about 10 nm or less. In some embodiments, each conductive layer of the shielding layer 24 may have a thickness in a range from about 10 nm to about 200 μm. In some embodiments, one or more conductive layers of the shielding layer 24 may have a thickness larger than about 200 μm, or smaller than about 10 nm. In some embodiments, the shielding layer 24 includes multiple conductive layers, and different conductive layers may have different thicknesses.

Since the lateral surface 203 of the substrate 20 protrudes from the lateral surface 123 of the package body 12 in a direction parallel to the top surface 201, a portion of the top surface 201 of the substrate 20 and the antenna 13 (including the first and second antenna patterns 13a, 13b) are exposed from the shielding layer 24. The conductive element 21m may include or define at least one hole to provide electrical connection between the antenna 13 and the electronic component 11.

Figure 3A:
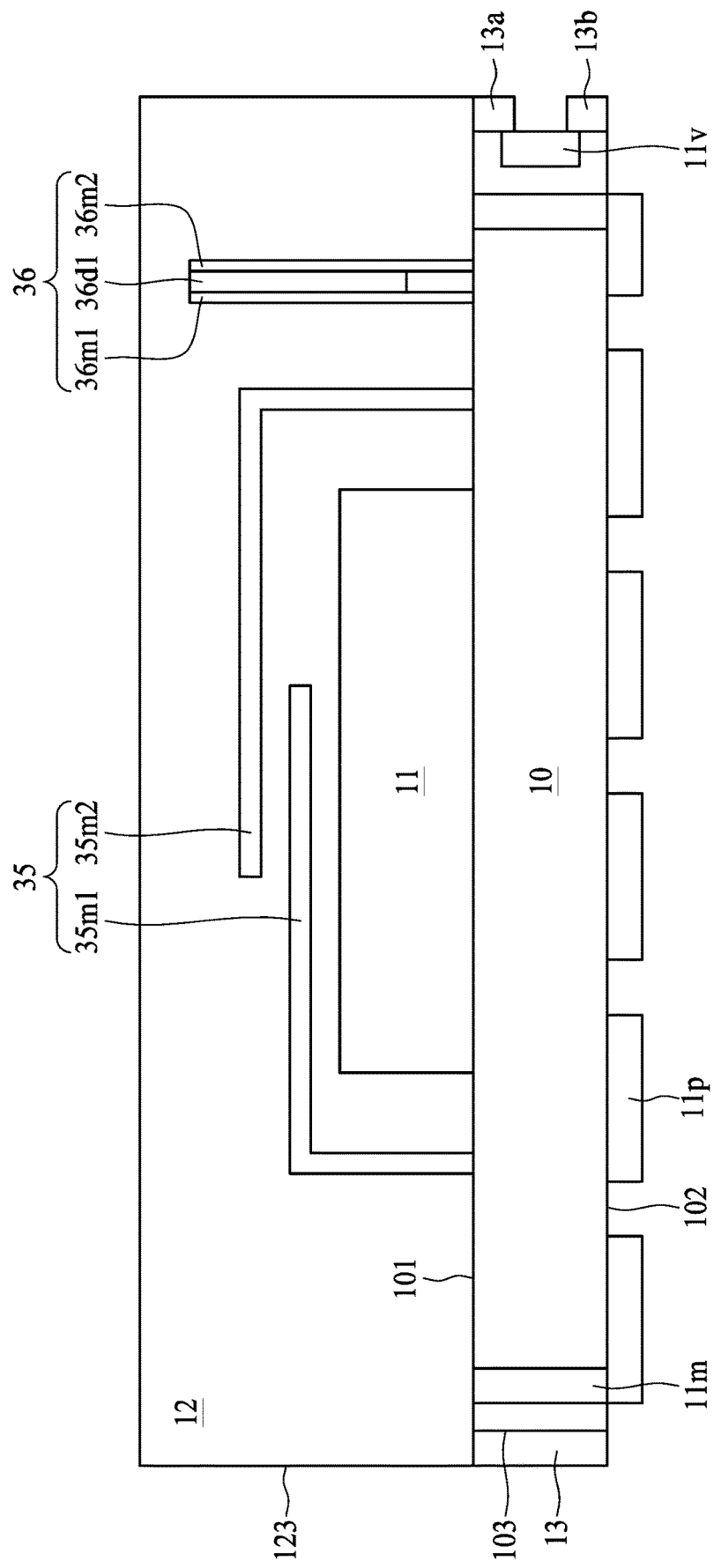
FIG. 3A illustrates a cross-sectional view of a semiconductor package device in accordance with some embodiments of the present disclosure.

FIG. 3A illustrates a cross-sectional view of a semiconductor package device 3A in accordance with some embodiments of the present disclosure. The semiconductor package device 3A is similar to the semiconductor package device 1 in FIG. 1A except that the semiconductor package device 3A further includes capacitors 35 and 36.

The capacitor 35 is disposed on the top surface 101 of the substrate 10. The capacitor 35 includes two terminals, a first metal plate 35m1 and a second metal plate 35m2. The first metal plate 35m1 is disposed on the top surface 101 of the substrate 10 and extends over the electronic component 11. The second metal plate 35$m$2 is disposed on the top surface 101 of the substrate 10 and extends over the first metal plate 35$m$1. For example, a portion of the second metal plate 35$m$2 overlaps a portion of the first metal plate 35$m$1 over the electronic component 11. In some embodiments, the capacitor 35 is connected to the electronic component 11 through the electrical connection within the substrate 10. In some embodiments, dielectric materials may be disposed between the overlapped portion of the first metal plate 35$m$1 and the second metal plate 35$m$2.

The capacitor 36 is disposed on the top surface 101 of the substrate 10. The capacitor 36 includes two terminals, a first metal plate (or first metal strip) 36$m$1 and a second metal plate (or second metal strip) 36$m$2, separated from each other. The first metal plate 36$m$1 is disposed on the top surface 101 of the substrate 10 and is substantially perpendicular to the top surface 101 of the substrate 10. The second metal plate 36$m$2 is disposed on the top surface 101 of the substrate 10 and is substantially perpendicular to the top surface 101 of the substrate 10. For example, the first metal plate 36$m$1 is parallel to the second metal plate 36$m$2. In some embodiments, the capacitor 36 is connected to the electronic component 11 through the electrical connection within the substrate 10. In some embodiments, dielectric materials 36$d$1 may be disposed between the first metal plate 36$m$1 and the second metal plate 36$m$2.

In comparable examples, a capacitor of a semiconductor package device would occupy a large area of the substrate. In accordance with some embodiments, by forming or disposing two metal plates 35$m$1, 35$m$2 of the capacitor 35 over the electronic component 11 or by forming or disposing two metal plates 36$m$1, 36$m$2 of the capacitor 36 perpendicular to the top surface 101 of the substrate 10, the area of the semiconductor package device 3A can be reduced.

Figure 3B:
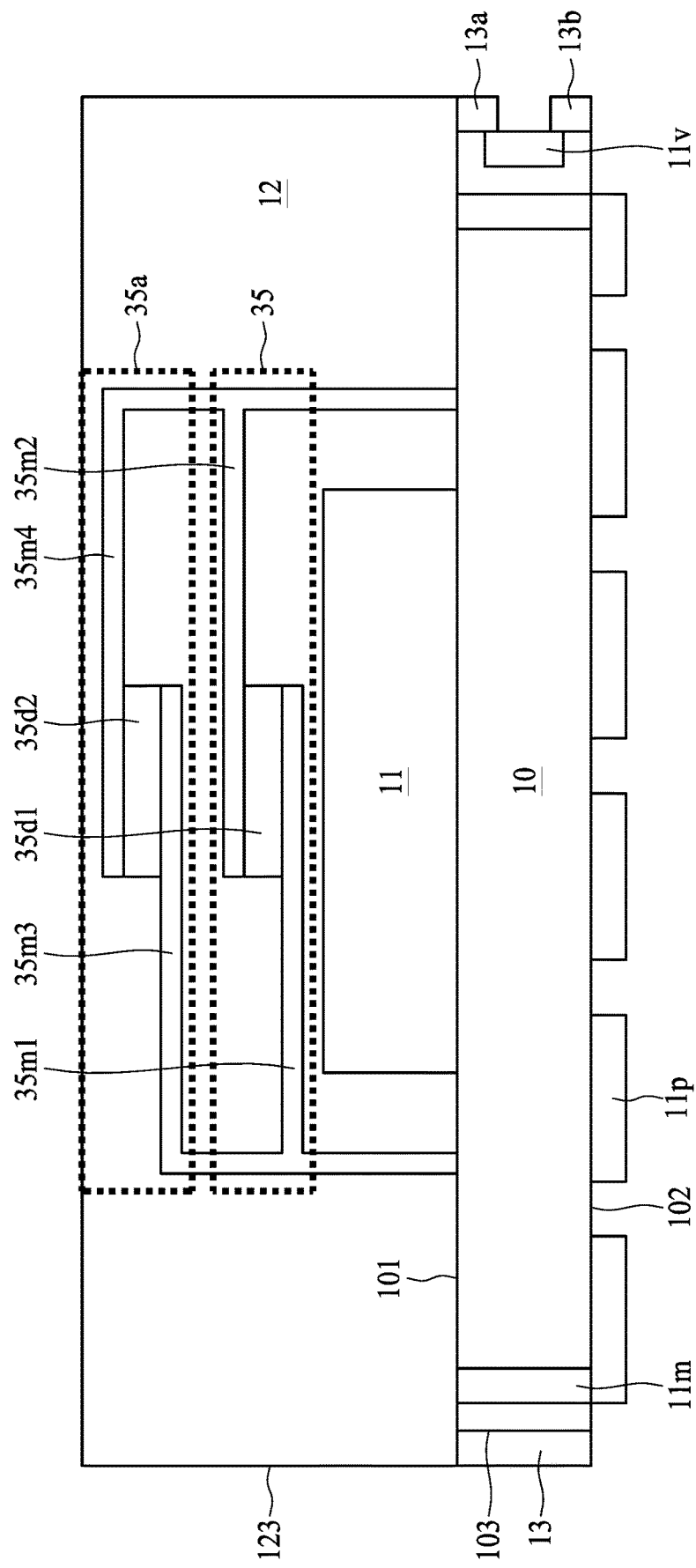
FIG. 3B illustrates a cross-sectional view of a semiconductor package device in accordance with some embodiments of the present disclosure.

FIG. 3B illustrates a cross-sectional view of a semiconductor package device 3B in accordance with some embodiments of the present disclosure. The semiconductor package device 3B is similar to the semiconductor package device 1 in FIG. 1A except that the semiconductor package device 3B further includes two capacitors 35 and 35$a$ connected in parallel.

The capacitor 35 shown in FIG. 3B is similar to the capacitor 35 shown in FIG. 3A. The capacitor 35$a$ includes two terminals, a first metal plate 35$m$3 and a second metal plate 35$m$4, extending over the first metal plate 35$m$1 and the second metal plate 35$m$2 of the capacitor 35. In some embodiments, the capacitor 35$a$ is connected to the electronic component 11 through the electrical connection within the substrate 10. In some embodiments, dielectric materials 35$d$1 and 35$d$2 may be respectively disposed between the overlapped portion of the first metal plate 35$m$1 and the second metal plate 35$m$2 of the capacitor 35 and the overlapped portion of the first metal plate 35$m$3 and the second metal plate 35$m$4 of the capacitor 35$a$.

Figure 3C:
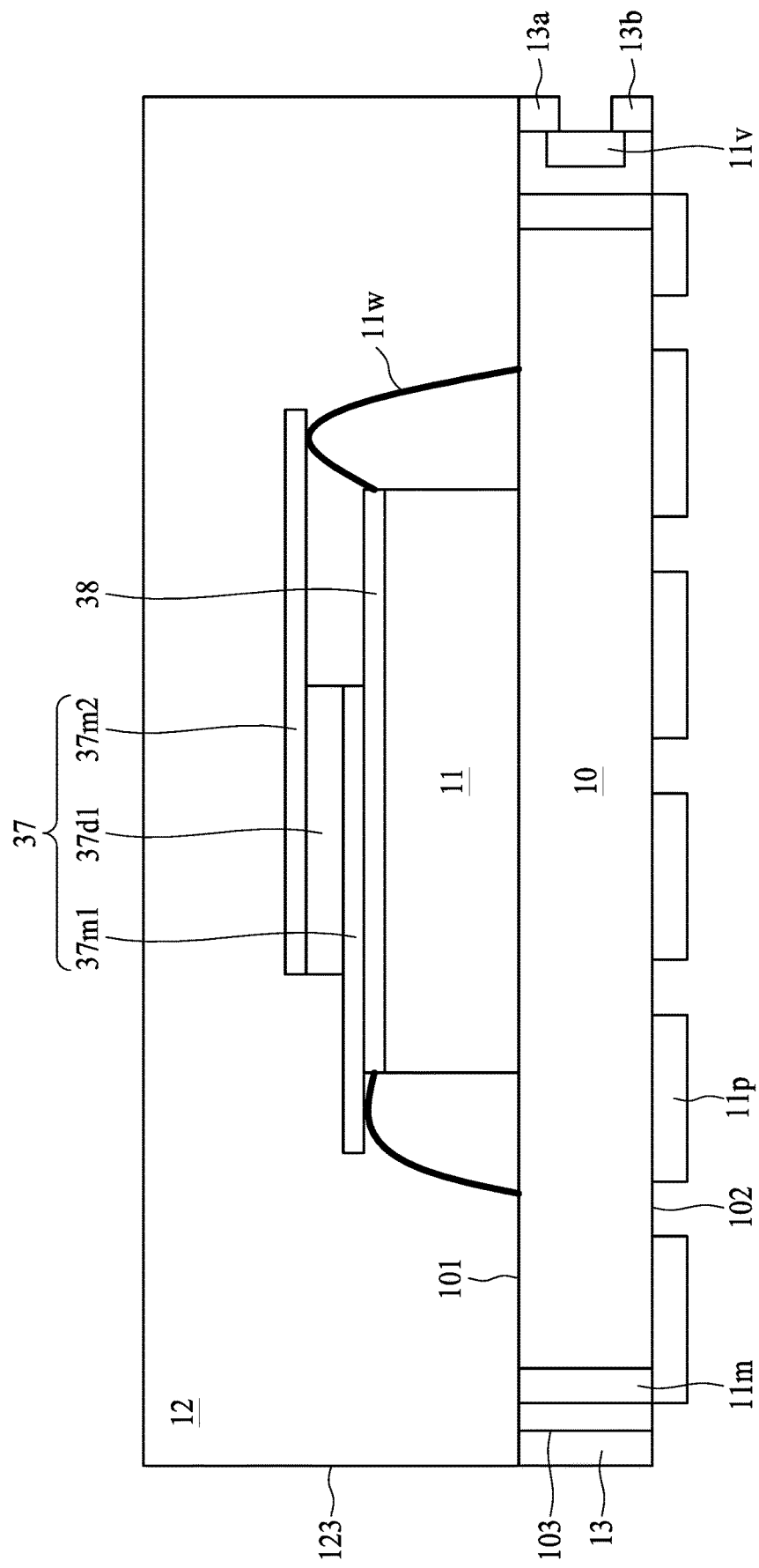
FIG. 3C illustrates a cross-sectional view of a semiconductor package device in accordance with some embodiments of the present disclosure.

FIG. 3C illustrates a cross-sectional view of a semiconductor package device 3C in accordance with some embodiments of the present disclosure. The semiconductor package device 3C is similar to the semiconductor package device 1 in FIG. 1A except that the semiconductor package device 3C further includes a capacitor 37.

The capacitor 37 is disposed over the electronic component 11. The capacitor 37 includes two terminals, a first metal plate 37$m$1 and a second metal plate 37$m$2. The first metal plate 37$m$1 is disposed over the electronic component 11 and is physically separated from a backside of the electronic component 11 through an insulating layer 38. The second metal plate 37$m$2 is disposed over the first metal plate 37$m$1 and is physically separated from the first metal plate 37$m$1 through a dielectric layer 37$d$1 or the package body 12. The capacitor 37 is connected to the electronic component 11 through a conductive wire 11$w$.

Figure 4A:
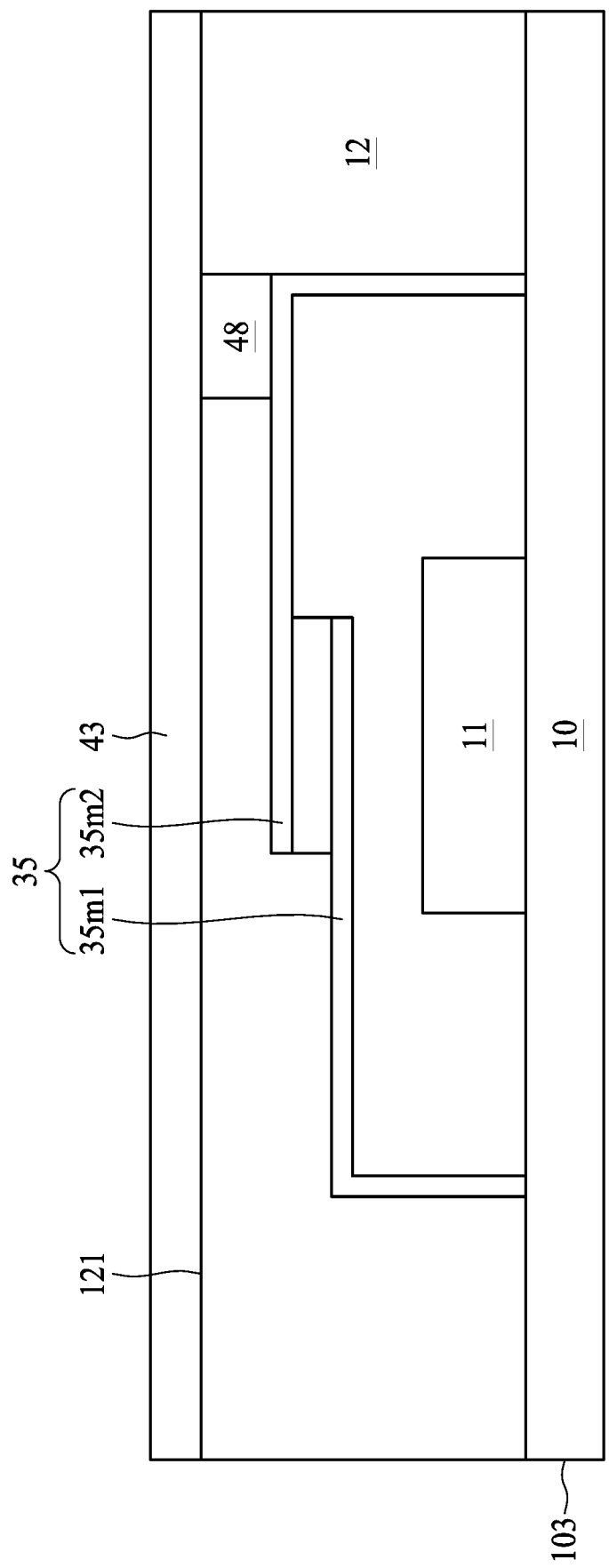
FIG. 4A illustrates a cross-sectional view of a semiconductor package device in accordance with some embodiments of the present disclosure.

FIG. 4A illustrates a cross-sectional view of a semiconductor package device 4A in accordance with some embodiments of the present disclosure. The semiconductor package device 4A is similar to the semiconductor package device 3A in FIG. 3A except that the antenna 43 of the semiconductor package device 4A is disposed on the package body 12.

As shown in FIG. 4A, the antenna 43 is disposed on a top surface 121 of the package body 12. The antenna 43 is connected to the capacitor 35 through a conductive element 48. In some embodiments, the capacitor 35 is connected to the electronic component 11 through the electrical connection within the substrate 10, and thus the antenna 43 can be connected to the electronic component 11 through the capacitor 35. In some embodiments, the capacitor 35 may act as a filter. In some embodiments, the semiconductor package device 4A may further include an antenna disposed on the lateral surface 103 of the substrate 10.

Figure 4B:
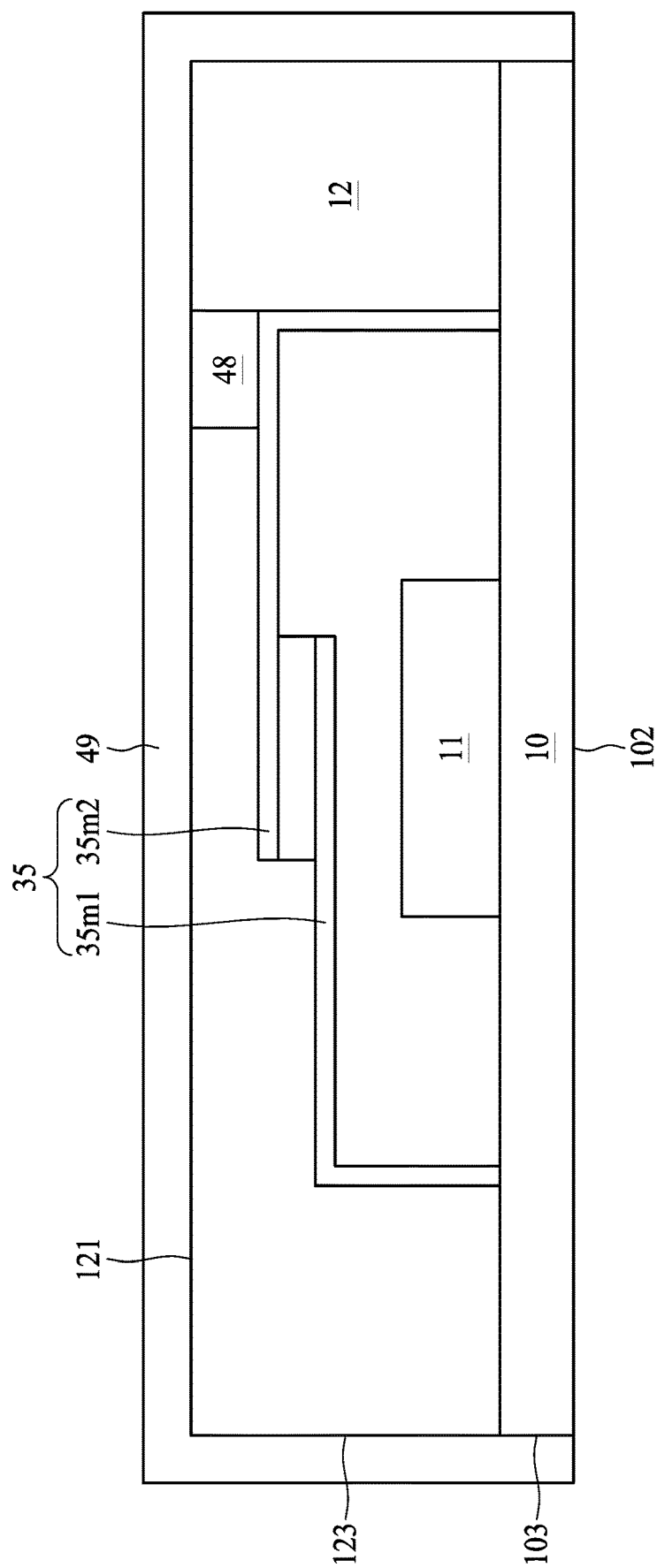
FIG. 4B illustrates a cross-sectional view of a semiconductor package device in accordance with some embodiments of the present disclosure.

FIG. 4B illustrates a cross-sectional view of a semiconductor package device 4B in accordance with some embodiments of the present disclosure. The semiconductor package device 4B is similar to the semiconductor package device 4A in FIG. 4A except that the semiconductor package 4B does not include any antenna.

A shielding layer 49 is disposed on the package body 12 to cover exterior surfaces (including the top surface 121 and the lateral surface 123) of the package body 12 and the lateral surface 103 of the substrate 10. The shielding layer 49 is connected to the grounding segment of the substrate 10 to provide EMI shielding for the electronic component 11. In some embodiments, the shielding layer 49 is a conformal shield. The shielding layer 49 is aligned with a bottom surface 102 of the substrate 10; for example, a bottom of the shielding layer 49 is substantially coplanar with the bottom surface 102 of the substrate 10. The shielding layer 49 is connected to the capacitor 35 through the conductive element 48.

In some embodiments, the shielding layer 49 is a conductive thin film, and may include, for example, Al, Cu, Cr, Sn, Au, Ag, Ni or stainless steel, or a mixture, an alloy, or other combination thereof. The shielding layer 49 may include a single conductive layer or multiple conductive layers. In some embodiments, the shielding layer 49 includes multiple conductive layers, and the multiple conductive layers may include a same material, some of the multiple conductive layers may include different materials from each other (e.g., while some of the multiple conductive layers may include the same material), or each of the multiple conductive layers may include different materials from each other. In some embodiments, each conductive layer of the shielding layer 49 has a thickness of up to about 200 μm, such as up to about 150 μm, up to about 100 μm, up to about 50 μm, up to about 10 μm, up to about 5 μm, up to about 1 μm, or up to about 500 nm, and down to about 100 nm or less, down to about 50 nm or less, or down to about 10 nm or less. In some embodiments, each conductive layer of the shielding layer 49 may have a thickness in a range from about 10 nm to about 200 μm. In some embodiments, one or more conductive layers of the shielding layer 49 may have a thickness larger than about 200 μm, or smaller than about 10 nm. In some embodiments, the shielding layer 49 includes multiple conductive layers, and different conductive layers may have different thicknesses.

Figure 5A:
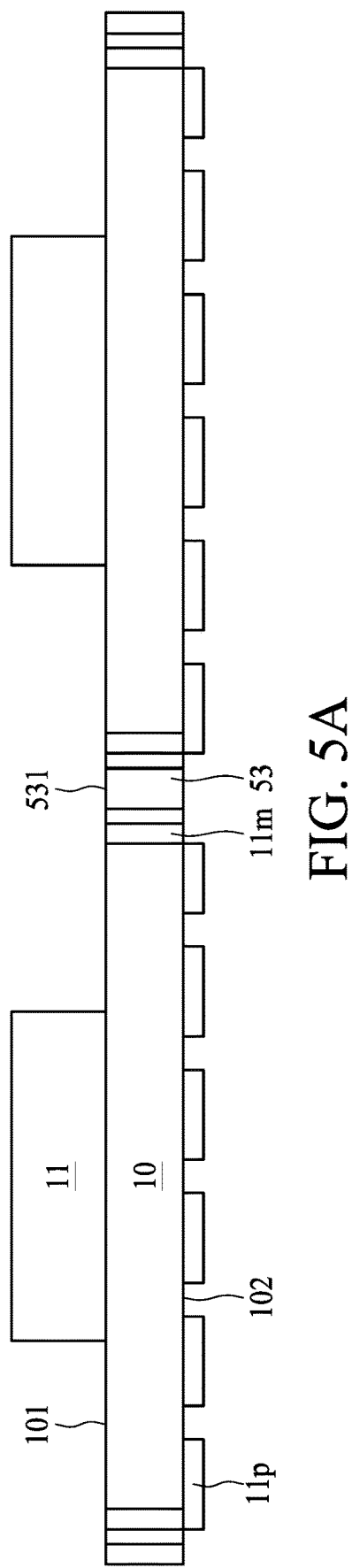
FIG. 5A, FIG. 5B and FIG. 5C illustrate a semiconductor manufacturing method in accordance with some embodiments of the present disclosure.
Figure 5B:
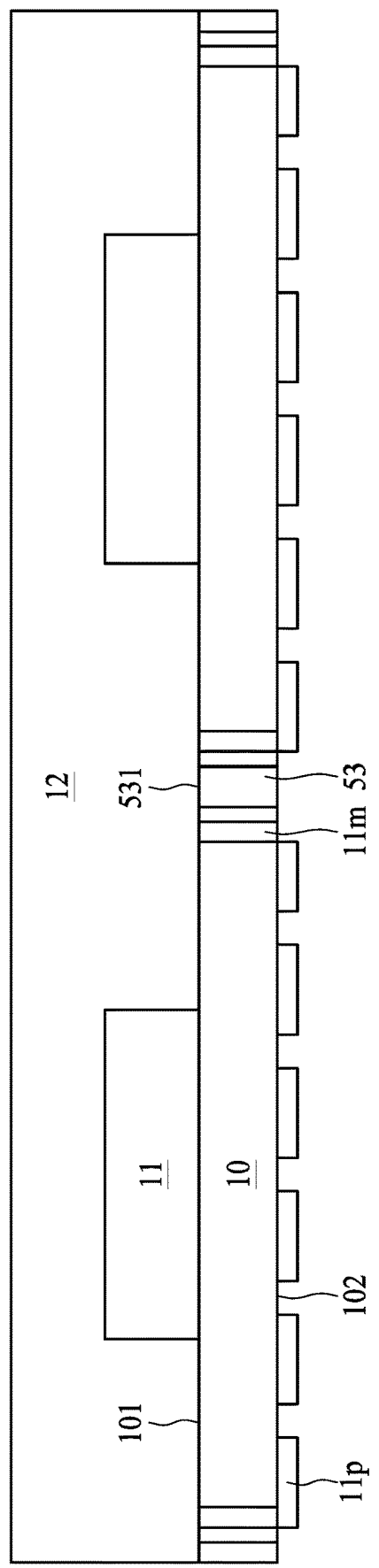
Figure 5C:
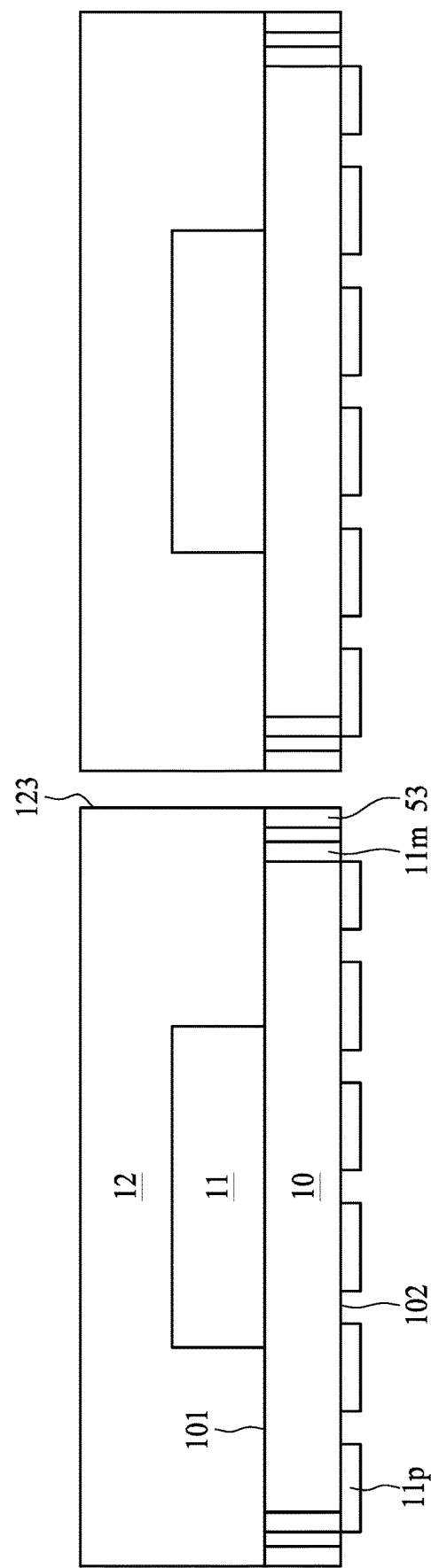

FIGS. 5A, 5B and 5C illustrate a semiconductor manufacturing method in accordance with some embodiments of the present disclosure.

Referring to FIG. 5A, a substrate strip including the substrate 10 is provided. The substrate 10 may be, for example, a printed circuit board, such as a paper-based copper foil laminate, a composite copper foil laminate, or a polymer-impregnated glass-fiber-based copper foil laminate. The substrate 10 may include an interconnection structure, such as an RDL or a grounding element.

The substrate 10 includes a predetermined antenna pattern 53 formed or disposed therein. In some embodiments, the predetermined antenna pattern 53 is formed or disposed at an interface between two adjacent individual substrates. In some embodiments, a top surface 531 of the antenna pattern 53 is exposed from the top surface 101 of the substrate 10. For example, the top surface 531 of the antenna pattern 53 is substantially coplanar with the top surface 101 of the substrate 10.

The substrate 10 further includes a conductive element 11m formed or disposed therein. The conductive element 11m is formed or disposed along and adjacent to the antenna pattern 53. The conductive element 11m is connected to a grounding segment of the substrate 10 to provide an EMI shield. For example, the conductive element 11m can prevent the electronic component 11, which will be formed or disposed in the subsequent process, from being interfered with by the radiation emitted by the antenna pattern 53. The conductive element 11m may have or define at least one hole, and thus the antenna pattern 53 can be connected with the electronic component 11 by a conductive connection passing through the hole. In some embodiments, the substrate 10 may include a plurality of conductive contacts 11p formed or disposed on its bottom surface 102. In some embodiments, the substrate 10 may be a multi-layer substrate and the feeding element of the antenna pattern 53 can be disposed at any layer of the substrate 10 depending on design specifications.

The electronic component 11 is formed or disposed on the top surface 101 of each substrate 10. The electronic component 11 may include a passive electronic component, such as a capacitor, a resistor or an inductor, or an active electronic component, such as an IC chip or a die. The electronic component 11 may be electrically connected to the substrate 10 (e.g., to the RDL), and electrical connection may be attained by way of flip-chip or wire-bond techniques.

Referring to FIG. 5B, a package body 12 is formed or disposed on the top surface 101 of the substrate strip to cover or encapsulate the electronic component 11 on each substrate 10 and the top surface 531 of the antenna pattern 53. For example, the package body 12 can be formed or disposed by applying an encapsulant on the top surface 101 of the substrate strip. In some embodiments, the encapsulant can include, for example, a Novolac-based resin, an epoxy-based resin, a silicone-based resin, or another suitable material. In some embodiments, the encapsulant can be applied using any of a number of molding techniques, such as compression molding, injection molding, or transfer molding.

Referring to FIG. 5C, a singulation operation is carried out to divide the substrate strip into a plurality of individual substrates. For example, the singulation operation can be carried out by cutting through the package body 12 and the substrate 10. In some embodiments, the singulation operation is carried out at an area of the substrate 10 in which the predetermined antenna pattern 53 is formed or disposed. After the singulation operation, the antenna 53 is exposed and is coplanar with the lateral surface 123 of the package body 12. In some embodiments, the singulation can be carried by cutting, laser cutting or by other suitable processes.

Figure 6A:
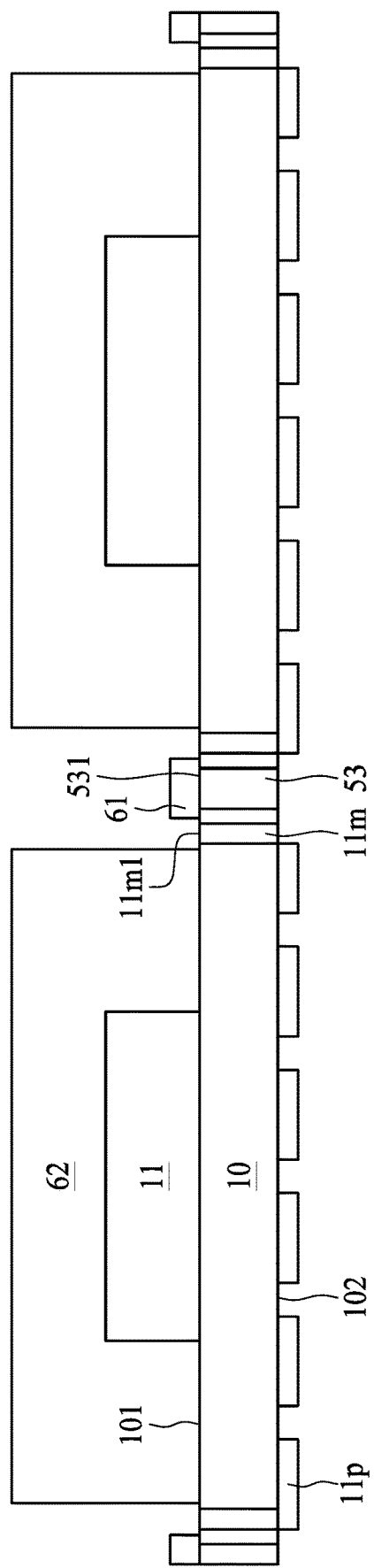
FIG. 6A, FIG. 6B and FIG. 6C illustrate a semiconductor manufacturing method in accordance with some embodiments of the present disclosure.
Figure 6B:
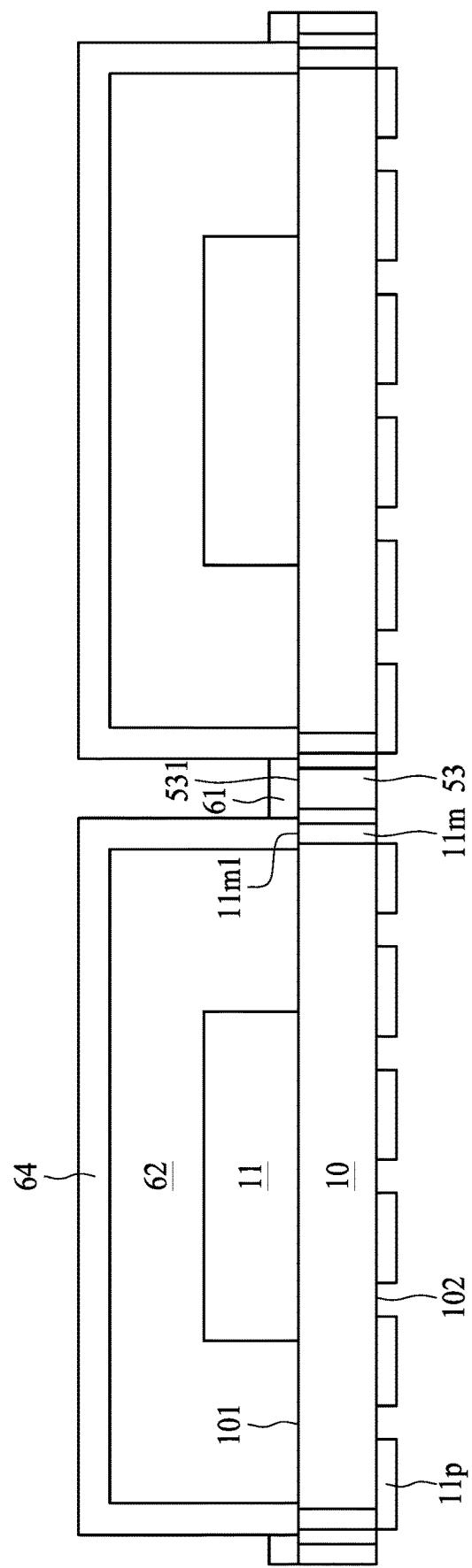
Figure 6C:
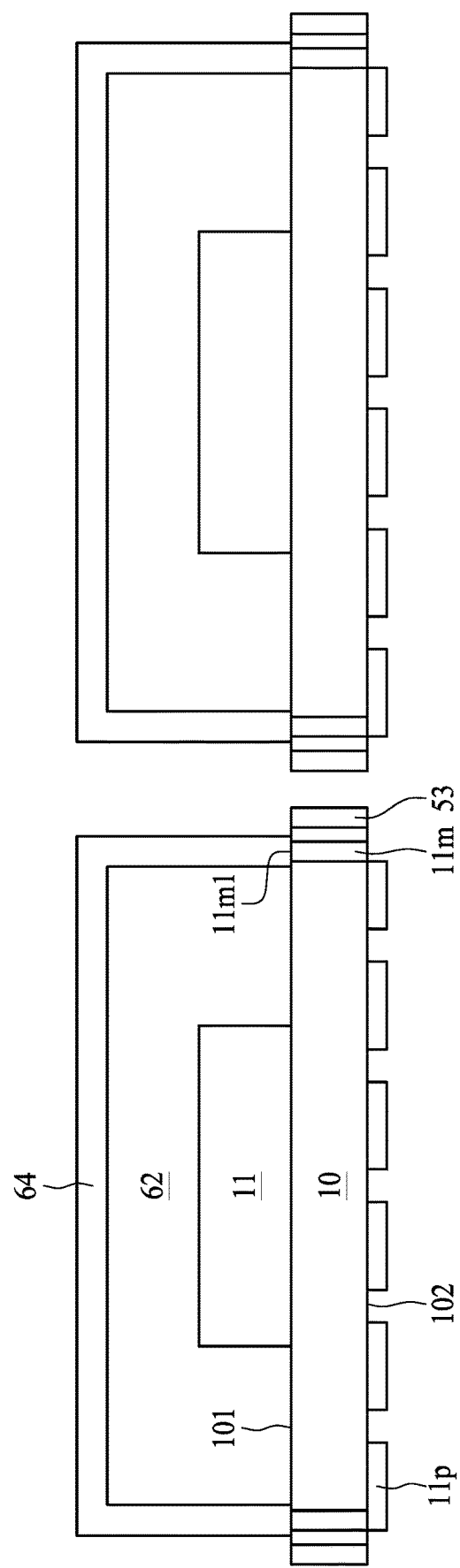

FIGS. 6A, 6B and 6C illustrate a semiconductor manufacturing method in accordance with some embodiments of the present disclosure. In some embodiments, the operation in FIG. 6A is carried out subsequent to the operation in FIG. 5A.

Referring to FIG. 6A, a package body 62 is formed or disposed on the top surface 101 of the substrate strip to cover or encapsulate the electronic component 11 on each substrate 10, and to expose a top surface 11m1 of the conductive element 11m and the top surface 531 of the antenna pattern 53. In some embodiments, the antenna pattern 53 is located at a periphery of each of the carrier units within the substrate strip. For example, the package body 62 can be formed or disposed by applying an encapsulant to the top surface 101 of the substrate strip. In some embodiments, the encapsulant can include, for example, a Novolac-based resin, an epoxy-based resin, a silicone-based resin, or another suitable material. In some embodiments, the encapsulant can be applied using an irregular molding process or a selective molding process.

An adhesive 61 is then formed or disposed on the top surface 531 of the antenna pattern 53 to cover the top surface 531 of the antenna pattern 53. The adhesive 61 is used to protect the top surface 531 of the antenna pattern 53 in the subsequent process.

Referring to FIG. 6B, a shielding layer 64 is formed or disposed on the package body 62 to covers exterior surfaces of the package body 62. The shielding layer 64 is electrically connected to the conductive element 11m of the substrate 10. The shielding layer 64 is grounded through the conductive element 11m. The shielding layer 64 and the conductive element 11m together provide EMI shielding for the electronic component 11. The shielding layer 64 can be formed or disposed using any of a number of coating techniques, such as electroless plating, electroplating, printing, spraying, sputtering, or vacuum deposition. The adhesive 61 is used to prevent the antenna pattern 53 from contacting the shielding layer 64 during the operation of forming or disposing the shielding layer 64.

Referring to FIG. 6C, the adhesive 61 is removed and a singulation operation is carried out to divide the substrate strip into a plurality of individual substrates. For example, the singulation operation can be carried out by cutting through the substrate 10. In some embodiments, the singulation operation is carried out at an area of the substrate 10 in which the predetermined antenna pattern 53 is formed or disposed. After the singulation operation, the antenna 53 is exposed. In some embodiments, the singulation can be carried out by cutting, laser cutting or by other suitable processes. In some embodiments, a plurality of separated carrier units (e.g., substrates 10) are formed after the singulation operation.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

Additionally, amounts, ratios, and other numerical values are sometimes presented herein in a range format. Such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device comprising:
a carrier having a first surface, a second surface opposite to the first surface and a lateral surface extending between the first surface and the second surface;
an electronic component disposed on the first surface of the carrier;
a molding compound disposed on the first surface of the carrier and encapsulating the electronic component, the molding compound having a lateral surface; and
an antenna disposed on at least a portion of the lateral surface of the carrier, the antenna having an outer surface,
wherein the antenna comprises a radiation pattern, and the outer surface of the antenna is substantially coplanar with the lateral surface of the molding compound.

2. The semiconductor package device of claim 1, further comprising a conductive element within the carrier and wherein the conductive element is adjacent to the lateral surface of the carrier.

3. The semiconductor package device of claim 2, wherein the conductive element is grounded to form an electromagnetic interference (EMI) shield.

4. The semiconductor package device of claim 2, wherein the conductive element defines a hole to provide an electrical connection between the antenna and the electronic component.

5. The semiconductor package device of claim 2, further comprising an EMI shield disposed on the molding compound to cover the molding compound, the EMI shield contacting the conductive element.

6. The semiconductor package device of claim 5, wherein a portion of the first surface of the carrier is exposed from the EMI shield.

7. The semiconductor package device of claim 1, wherein the lateral surface of the carrier is recessed from a lateral surface of the molding compound.

8. The semiconductor package device of claim 1, wherein the antenna comprises a first antenna pattern and a second antenna pattern separated from the first antenna pattern, the first antenna pattern electrically connecting to the second antenna pattern through a via within the carrier.

9. The semiconductor package device of claim 1, further comprising a capacitor disposed on the first surface of the carrier, the capacitor comprising:
a first metal plate disposed on the first surface of the carrier and including an extended portion extending over the electronic component; and
a second metal plate disposed on the first surface of the carrier and including an extended portion extending over the first metal plate, wherein the extended portion of the second metal plate overlaps the extended portion of the first metal plate.

10. The semiconductor package device of claim 9, wherein the capacitor further comprises a dielectric material disposed between the first metal plate and the second metal plate.

11. The semiconductor package device of claim 9, wherein the capacitor further comprises:
a third metal plate electrically connected to the first metal plate and including an extended portion that extends over the second metal plate; and
a fourth metal plate electrically connected to the second metal plate and including an extended portion that extends over the third metal plate.

12. The semiconductor package device of claim 11, wherein the extended portion of the fourth metal plate overlaps the extended portion of the third metal plate.

13. The semiconductor package device of claim 11, wherein the capacitor further comprises a dielectric material disposed between the third metal plate and the fourth metal plate.

14. The semiconductor package device of claim 1, further comprising a capacitor disposed on the first surface of the carrier, the capacitor comprising:
a first metal strip disposed on the first surface of the carrier and extending substantially perpendicular to the first surface of the carrier;
a second metal strip disposed on the first surface of the carrier and adjacent to the first metal strip, wherein the second metal strip extends substantially parallel to the first metal strip; and
a dielectric material disposed between the first metal strip and the second metal strip.

15. The semiconductor package device of claim 1, further comprising:
an insulating layer disposed on a backside of the electronic component;
a capacitor disposed on the insulating layer, the capacitor comprising:
a first metal strip disposed on the insulating layer;
a dielectric layer disposed on the first metal strip; and
a second metal strip disposed on the dielectric layer; and
a conductive wire electrically connecting the capacitor to the electronic component.

16. A semiconductor package device comprising:
a carrier having a first surface, a second surface opposite to the first surface and a lateral surface extending between the first surface and the second surface;
an electronic component disposed on the first surface of the carrier;
a molding compound disposed on the first surface of the carrier and encapsulating the electronic component; and
a capacitor disposed on the first surface of the carrier, the capacitor comprising:
a first metal plate disposed on and in contact with the first surface of the carrier and including an extended portion extending over the electronic component; and
a second metal plate disposed on and in contact with the first surface of the carrier and including an extended portion extending over the first metal plate, wherein the extended portion of the second metal plate overlaps the extended portion of the first metal plate.

17. The semiconductor package device of claim 16, further comprising a shielding layer covering at least a top surface of the molding compound.

18. The semiconductor package device of claim 17, wherein the shielding layer is electrically connected to the second metal plate.

19. The semiconductor package device of claim 17, wherein the shielding layer covers the top surface and a lateral surface of the molding compound.

20. The semiconductor package device of claim 16, wherein the molding compound encapsulates the capacitor.

* * * * *